US009829809B2

(12) United States Patent
Avneri et al.

(10) Patent No.: US 9,829,809 B2
(45) Date of Patent: Nov. 28, 2017

(54) SYSTEM AND METHOD FOR ATTACHING A MASK TO A MASK HOLDER

(71) Applicant: APPLIED MATERIALS ISRAEL LTD., Rehovot (IL)

(72) Inventors: Israel Avneri, Ramat-Gan (IL); Igor Krivts (Krayvitz), Rehovot (IL); Yoram Uziel, Misgav (IL); Nir Ben-David Dodzin, Hod Hasharon (IL); Ido Holcman, Rehovot (IL)

(73) Assignee: APPLIED MATERIALS ISRAEL LTD., Rehovot (IL)

( * ) Notice: Subject to any disclaimer, the term of this patent is extended or adjusted under 35 U.S.C. 154(b) by 0 days.

(21) Appl. No.: 15/040,908

(22) Filed: Feb. 10, 2016

(65) Prior Publication Data
US 2016/0161869 A1 Jun. 9, 2016

Related U.S. Application Data

(63) Continuation of application No. PCT/US2014/050596, filed on Aug. 11, 2014.
(Continued)

(51) Int. Cl.
*G03B 27/62* (2006.01)
*G03B 27/58* (2006.01)
(Continued)

(52) U.S. Cl.
CPC .......... *G03F 9/7096* (2013.01); *G03F 7/0002* (2013.01); *H01L 21/67359* (2013.01); *H01L 21/67775* (2013.01); *H01L 21/67778* (2013.01)

(58) Field of Classification Search
CPC ............... G03F 7/7096; G03F 7/70058
(Continued)

(56) References Cited

U.S. PATENT DOCUMENTS 6,960,772 B1 11/2005 Johnson et al.
7,394,526 B2 * 7/2008 Shibazaki ............... G03F 7/707
355/72
(Continued)

FOREIGN PATENT DOCUMENTS

JP 2007178819 A 7/2007
JP 2009217008 A 9/2009
(Continued)

OTHER PUBLICATIONS

PCT/US2014/050596, "International Preliminary Report on Patentability", dated Feb. 25, 2016, 6 pages.
(Continued)

*Primary Examiner* — Hung Henry Nguyen
(74) *Attorney, Agent, or Firm* — Kilpatrick Townsend & Stockton LLP

(57) ABSTRACT

A system for coupling a mask to a mask holder. The system includes a base, an aperture; mask holder cover supporting elements arranged to move between a first position and a third position while supporting the mask holder cover; mask supporting elements arranged to move between a fourth position and a sixth position while supporting the mask; mask holder base supporting elements arranged to support the mask holder base. When the mask holder cover supporting elements are at the first position and the mask supporting elements are at the third position the mask holder cover, the mask and the base are spaced apart from each other. When the mask holder cover supporting elements are at the third position and the mask supporting elements are at the sixth position the mask holder cover, the mask and the base are connected to each other.

17 Claims, 15 Drawing Sheets

Related U.S. Application Data

(60) Provisional application No. 61/865,127, filed on Aug. 12, 2013.

(51) Int. Cl.
  *G03F 9/00* (2006.01)
  *H01L 21/673* (2006.01)
  *H01L 21/677* (2006.01)
  *G03F 7/00* (2006.01)

(58) Field of Classification Search
  USPC .................................................... 355/72–76
  See application file for complete search history.

(56) References Cited

U.S. PATENT DOCUMENTS

| | | | |
|---|---|---|---|
| 2002/0080339 A1* | 6/2002 | Takahashi | G03B 27/58 355/72 |
| 2010/0110603 A1 | 5/2010 | Lafontaine et al. | |
| 2013/0075605 A1 | 3/2013 | Krivts et al. | |

FOREIGN PATENT DOCUMENTS

| | | |
|---|---|---|
| WO | 2013084388 A1 | 6/2013 |
| WO | 2015023606 | 2/2015 |

OTHER PUBLICATIONS

PCT/US2014/050596, "International Search Report", dated Dec. 2, 2014, 9 pages.

\* cited by examiner

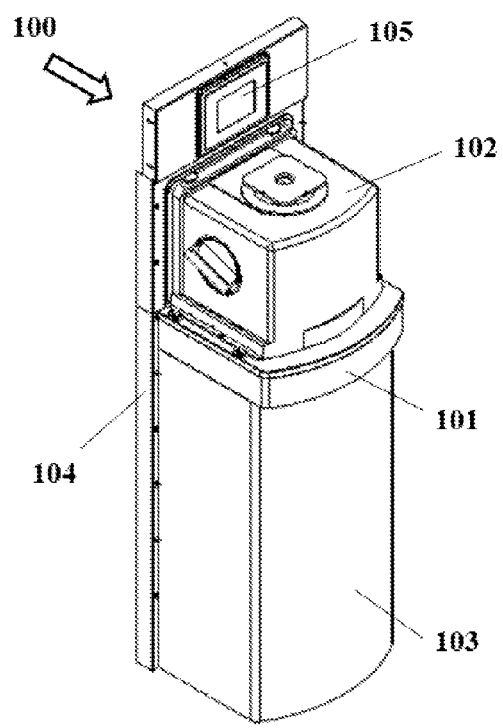
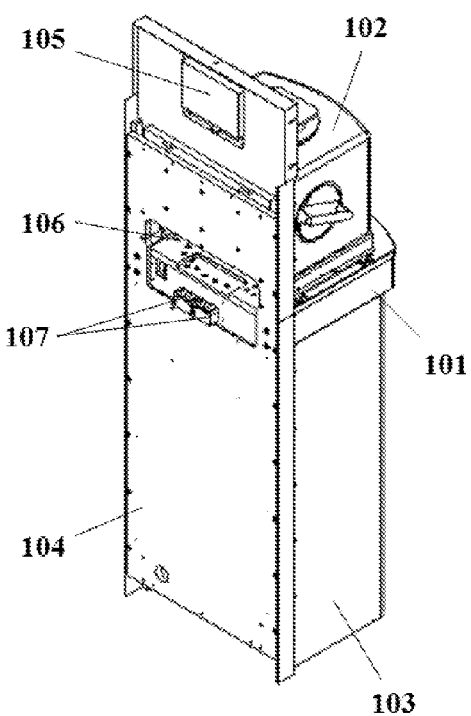
a)
FIG. 5A
b)
FIG. 5B

SYSTEM AND METHOD FOR ATTACHING A MASK TO A MASK HOLDER

CROSS-REFERENCES TO RELATED APPLICATIONS

This application is a continuation of and claims priority to PCT/US2014/050596, filed Aug. 11, 2014; which claims the benefit of U.S. Provisional Patent Application No. 61/865,127, filed Aug. 12, 2013. The disclosures of each of the PCT/US2014/050596 and 61/865,127 applications are herein incorporated by reference in their entirety for all purposes.

BACKGROUND OF THE INVENTION

Semiconductor devices and liquid crystal display devices are produced by the so-called photolithography technique in which a pattern formed on a mask is transferred onto a photosensitive substrate. The exposure apparatus, which is used in the photolithography step, includes a mask stage for supporting the mask and a substrate stage for supporting the substrate. The pattern on the mask is transferred onto the substrate via a projection optical system while successively moving the mask stage and the substrate stage. In recent years, it is demanded to realize the higher resolution of the projection optical system in order to respond to the further advance of the higher integration of the device pattern. As the exposure wavelength to be used is shorter, the resolution of the projection optical system becomes higher. As the numerical aperture of the projection optical system is larger, the resolution of the projection optical system becomes higher. Therefore, the exposure wavelength, which is used for the exposure apparatus, is shortened year by year, and the numerical aperture of the projection optical system is increased as well.

If the patterns formed on the mask have any defects or distortions, such defects or distortions may result in lower exposure precision. For example, the patterns cannot be transferred to desired positions, or the shapes of the patterns may be transferred incorrectly. A pellicle is often used with a mask. A pellicle is a thin transparent layer that may be stretched over a frame above the surface of a reticle. Pellicles are used to block particles from reaching the patterned side of a reticle surface. Although particles on the pellicle surface are out of the focal plane and should not form an image on the wafer being exposed, it is still preferable to keep the mask surfaces as particle-free as possible. For certain types of lithography (e.g., extreme ultraviolet (EUV) lithography), however, pellicles are not used. Because the EUV masks are not covered, they are prone to particle contamination, which may cause defects in a lithographic process. Particles on EUV masks are one of the main sources of imaging defects. Inspection and cleaning of a EUV mask before moving the mask to an exposure position can be an important aspect of a mask handling process. Masks are typically cleaned when contamination is suspected, as a result of inspection, or on the basis of historical statistics.

A method of inspecting masks uses images obtained by scanning electron microscopes (SEM) is well-known. It is a common practice to acquire an SEM image of a high-magnification SEM image in a restricted narrow field of view with a high-magnification. In addition, if a wide field of view is scanned by an ordinary critical dimension SEM, various kinds of aberrations such as the astigmatism, the field curvature, and the distortion inevitably take place. These kinds of aberrations must be corrected, dynamically, in a simultaneous manner with the scanning action.

To obtain SEM high quality images with high resolution a high voltage bias on the mask should be used. In this case a special mask holder is used for handling a mask both within the inspection tool and out of the tool.

BRIEF SUMMARY OF THE INVENTION

According to an embodiment of the invention, there is provided a system for coupling a mask to a mask holder that includes a mask holder base and a mask holder cover. The system includes a base; an aperture that is shaped and sized to facilitate a passage of a mask and the mask holder cover through the aperture; mask holder cover supporting elements that are arranged to move between a first position and a third position while supporting the mask holder cover; mask supporting elements that are arranged to move between a fourth position and a sixth position while supporting the mask; and mask holder base supporting elements that are arranged to support the mask holder base without preventing the passage of the mask through the aperture. The mask holder cover supporting elements are at the first position, the mask supporting elements are at the third position the mask holder cover, and the mask and the base are spaced apart from each other and the mask holder cover is positioned above the mask and the mask holder base. When the mask holder cover supporting elements are at the third position and the mask supporting elements are at the sixth position the mask holder cover, the mask and the base are connected to each other.

According to another embodiment of the invention, there is provided a method for coupling a mask to a mask holder that includes a mask holder base and a mask holder cover. The method includes: positioning mask holder cover supporting elements, that support the mask holder cover, at a first position; positioning mask supporting elements, that support the mask holder base, at a fourth position; receiving the mask through the aperture by the mask supporting elements, wherein the mask is positioned between the mask holder cover and the mask holder base; positioning the mask holder cover supporting elements at a third position, positioning the mask supporting elements at a sixth position thereby connecting the mask holder cover, the mask and the mask holder base to each other; and positioning the mask holder cover supporting elements at the first position and positioning the mask supporting elements at the third position thereby positioning the mask holder cover, the mask and the mask holder base that are connected each other in front of the aperture

BRIEF DESCRIPTION OF THE DRAWINGS

Further details, aspects and embodiments of the invention will be described, by way of example only, with reference to the drawings. In the drawings, like reference numbers are used to identify like or functionally similar elements. Elements in the figures are illustrated for simplicity and clarity and have not necessarily been drawn to scale.

FIGS. 5A-5B are isometric views of the system according to an embodiment of the invention;

DETAILED DESCRIPTION OF THE INVENTION

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings.

In the following detailed description, numerous specific details are set forth in order to provide a thorough understanding of the invention. However, it will be understood by those skilled in the art that the present invention may be practiced without these specific details. In other instances, well-known methods, procedures, and components have not been described in detail so as not to obscure the present invention.

There is provided a system and method for enabling a safe and clean handling of a semiconductors standard/EUV mask coupled with an adaptor (holder & shield. Two major critical considerations involved in this apparatus: mask cleanliness and mask safety.

All figures illustrate embodiments of the invention. The number, shape, size and location of elements may differ from those illustrated in the specification and drawings without departing from the spirit of the invention.

Figure 1:
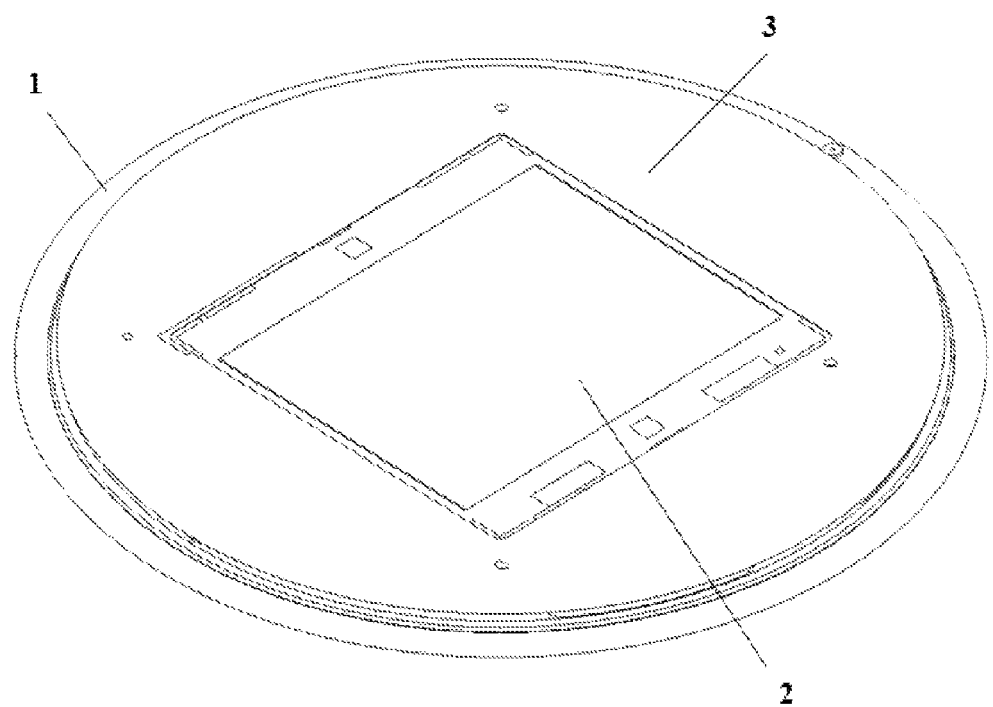
FIG. 1. is an isometric view of a mask holder according to an embodiment of the invention.

The system is intended for mounting/dismounting the EUV mask on the special mask holder that consists of mask holder base and mask holder cover. FIG. 1 represents the isometric view of the special holder that contains mask holder base 1, mask 2 and a mask holder cover 3.

Figure 2:
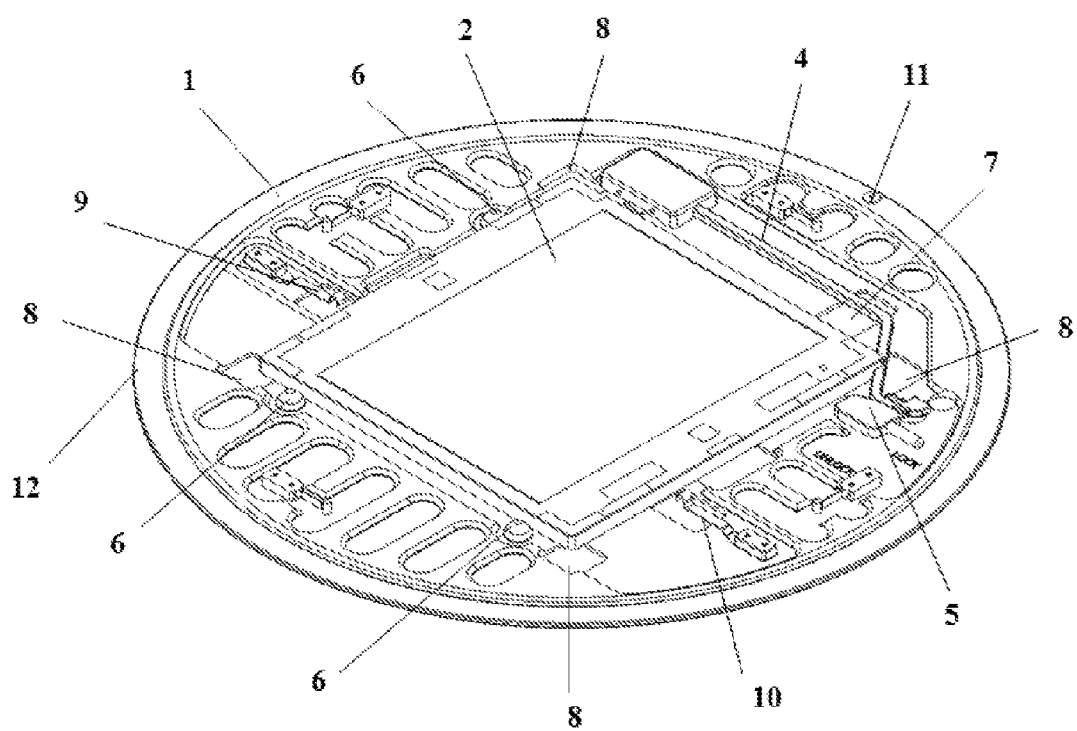
FIG. 2. Is an isometric view of a mask holder base according to an embodiment of the invention.
Figure 3:
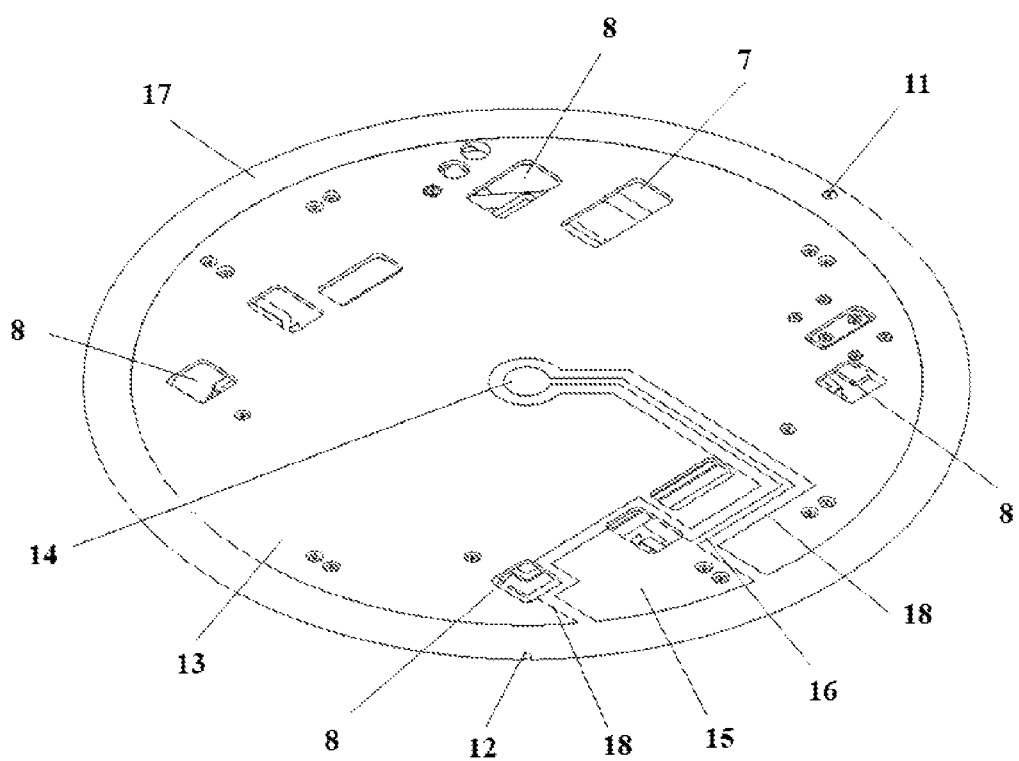
FIG. 3. is an isometric view of the back side of the mask holder according to an embodiment of the invention.

The isometric view of the mask holder base is shown in FIG. 2.

The mask holder base includes mask aligning spring 4, the handle cam 5, three mask borders 6, window 7 for automatically release of the mask 2, four windows 8 for mask moves up and down with four special pillars (not shown) in this figure, two electrical contact springs 8 and 9, and special insert 11 for sensor that indicates the mask orientation.

The mask holder base can be made of insulating ceramic (for example, Alumina with conductive coating (for instance, hard chrome.

The handle cam 5 is designed for manual release of the mask 2 from the aligning spring 4. The automatic release is carried out by a mask alignment element manipulator that extends through the window 7.

The mask holder base 1 has notch 12 for mechanical aligning on the system and for orientation indication within the inspection/metrology tool.

Figure 4:
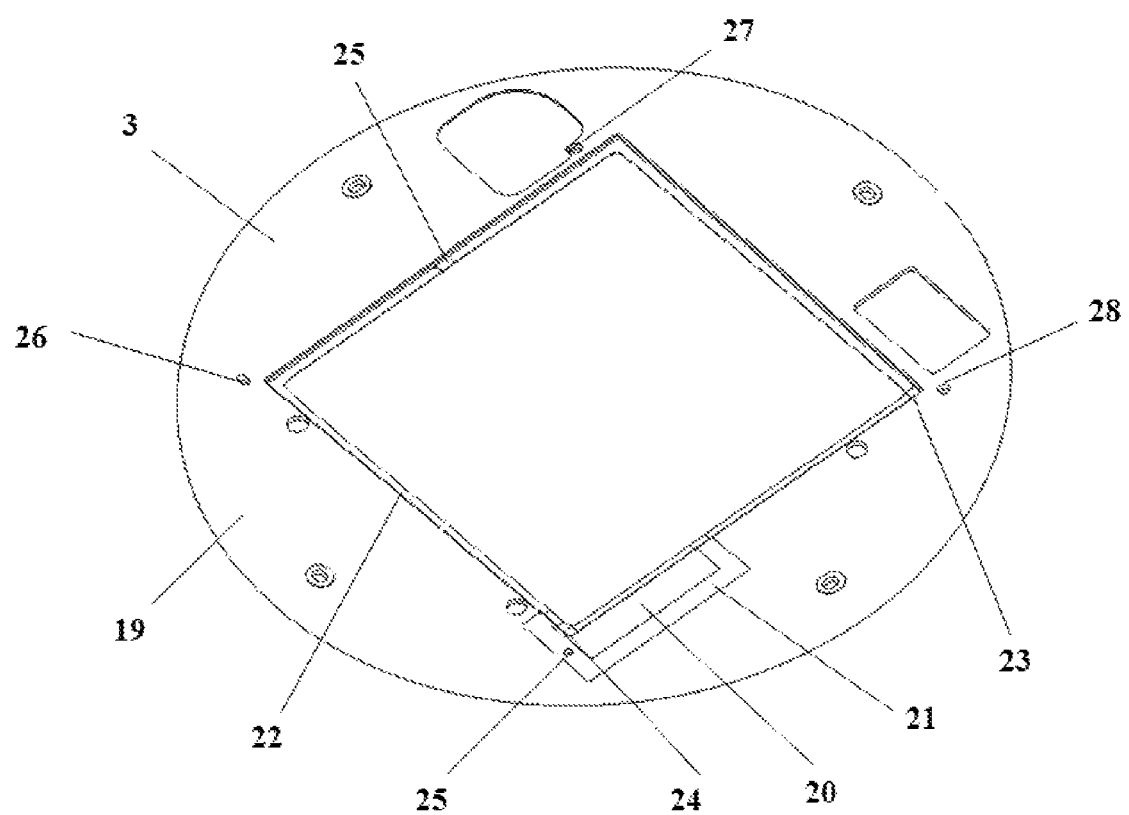
FIG. 4. is an isometric view of the back side of the mask holder cover according to an embodiment of the invention.

The back side of the mask holder base 1 is shown in FIG. 4 where the whole surface is divided on three parts. First one is large conductive coating area 13, second area is the small conductive coating areas 14 and 15 which are connected by conductive path 16. The insulated areas 17 and 18 separate conductive area 13 and areas 14, 15 and 16. The conductive area 13 is connected to the contact spring 10 and conductive spring 9 is connected to the conductive area 15. It is allows performing the electric conductivity test and zapping procedure.

FIG. 4 represents the back side of mask holder cover 3.

Four holes 25, 26, 27 and 28 are intended for mount and dismount of the mask holder cover 3 on the front side of the mask 2. It is performed by special mechanism of the system (not shown). The mask holder cover 3 can be made of insulate material, for example Alumina ceramic, and has the conductive coating, for example hard chrome, on the whole surface except for surface on the front side and surface 19 on the back side.

The backside of the mask holder cover may have a small conductive area 20 that is separated from large conductive area 19 by insulated path 21 that allows performing the electric conductivity test and zapping procedure.

In this case when the mask holder cover 3 is mounted on the mask 2 and the mask 2 is mounted on the mask holder base 1 the contact spring 10 has electrical contact with surface 19 and contact spring 9 has electrical contact with surface 20. The square pocket 22 on the central part of the mask holder cover 3 is intended for cover mounting on the mask 2. The mask holder cover 3 contacts the mask 2 via three outstanding small surfaces 23, 24 and 25. From electrical contact point of view the outstanding surface 24 is the integral part of the surface 20 and two outstanding surfaces 23 and 25 are integral parts of the remaining coating part 19 of the back side of the mask holder cover 3. The orientation of the three outstanding surfaces 23, 24 and 25 are depended on the orientation of the mechanical contacts permitted areas on the front surface of the mask 2.

FIGS. 5A and 5B represent the isometric views of the system 100, where FIG. 5B is view of back side of the system 100 and FIG. 5A is view of the front side of the system 100.

The system may include: base 101, protecting cover 102, enclosure 103, interface front panel 104, display 105, an aperture such as load/unload window 106, and two sensors of the external transfer unit 107.

The base 101 may include an upper surface that may be proximate to the mask 1 and the mask holder (2 and 3) and may also include all mechanisms that assist in connecting the mask holder base 1, the mask 2 and the mask holder cover 3. The protection cover 102 is intended for cleanness issue and it may provide a laminar flow of gas within its internal volume and protects the mask 2 from contaminated environment around the system 100.

The enclosure 103 protects the internal bottom volume of the system 100 where the control system, actuators and utility devices are situated. Interface front panel 104 has the load/unload window via it an external transfer unit (not shown in FIG. 5) that may perform load or unload operations of the mask 2 and load or unload operations of the combination of mask and mask holder. The display and user interface 105 of the control system is on the interface front panel 104 too. Two sensors 107 intended for detection of the external transfer unit end effectors. Basically the external transfer unit has two end effectors, first one is used for mask and second one—for combined holder.

Figure 6:
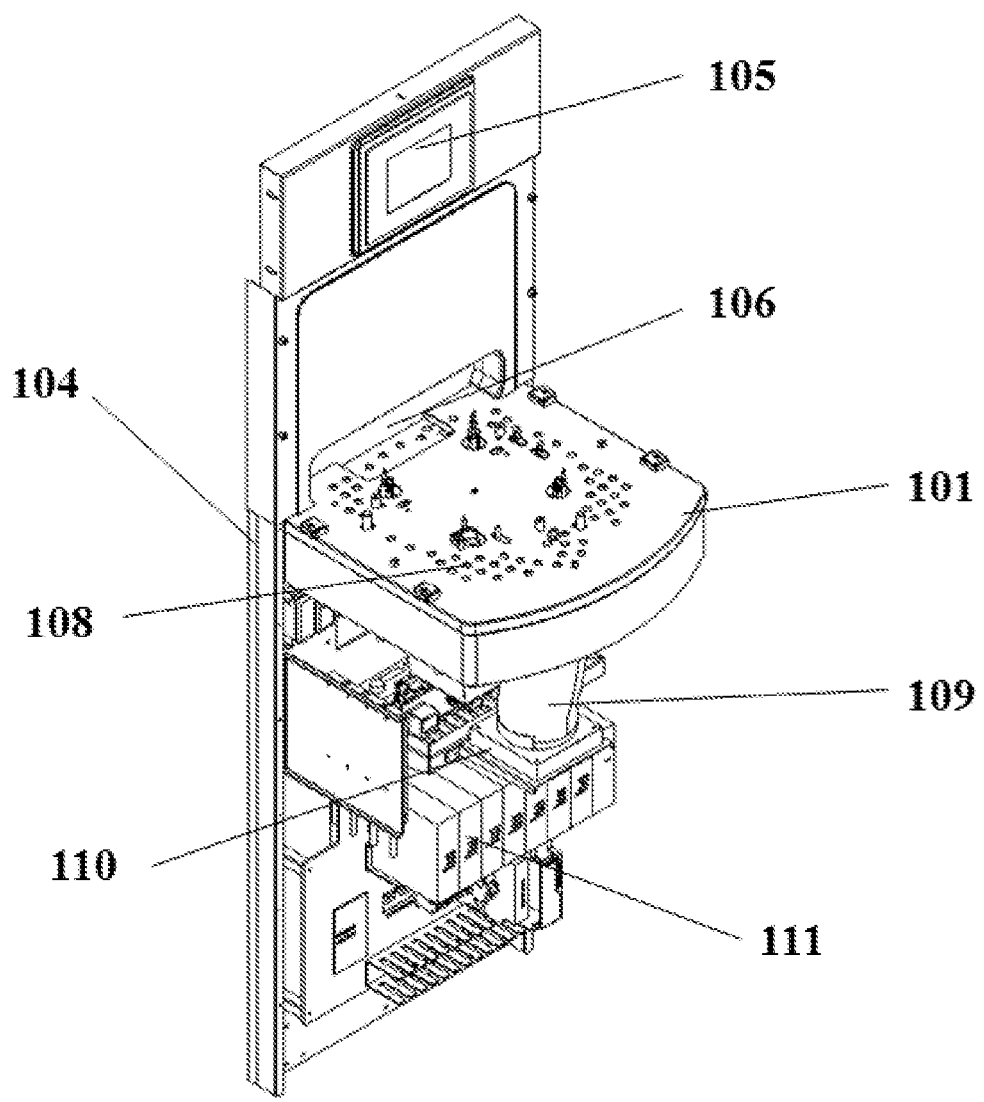
FIG. 6. is an isometric views of the system according to an embodiment of the invention.

FIG. 6 represents the isometric view of the system 100 without protection cover 102 and enclosure 103. The holes 108 on the base 101 are designed to exhaust air from inside volume of the protection cover 102 out by the exhaust fan 110 that is mounted on the exhaust enclosure 109. It provides a laminar flow of air inside the protection cover 102, wherein the gas can flow from holes 108 into the space defined by the protective cover and through the load/unload window 106—or follow the reverse path. Control system 111 is designed to control all mechanisms and devices of the system.

Figure 7:
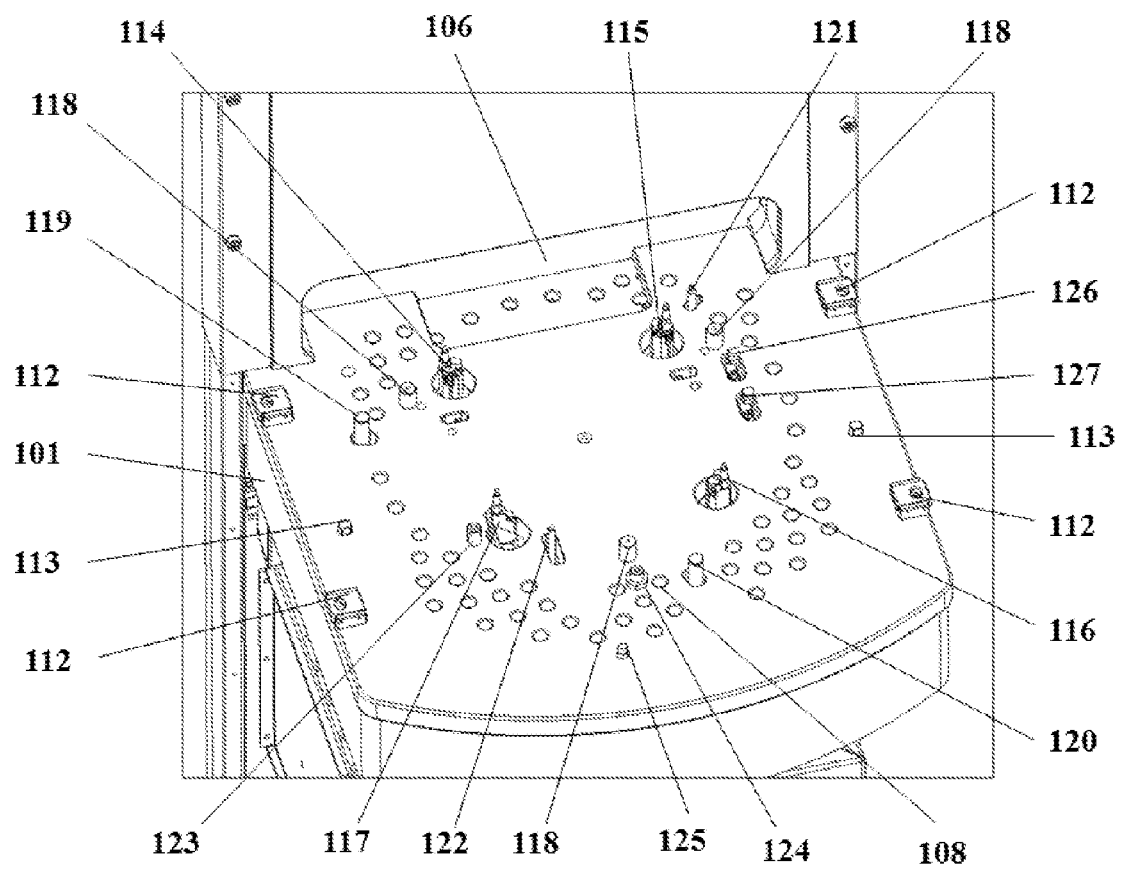
FIG. 7. is an isometric view of a base of the system according to an embodiment of the invention.
Figure 8:
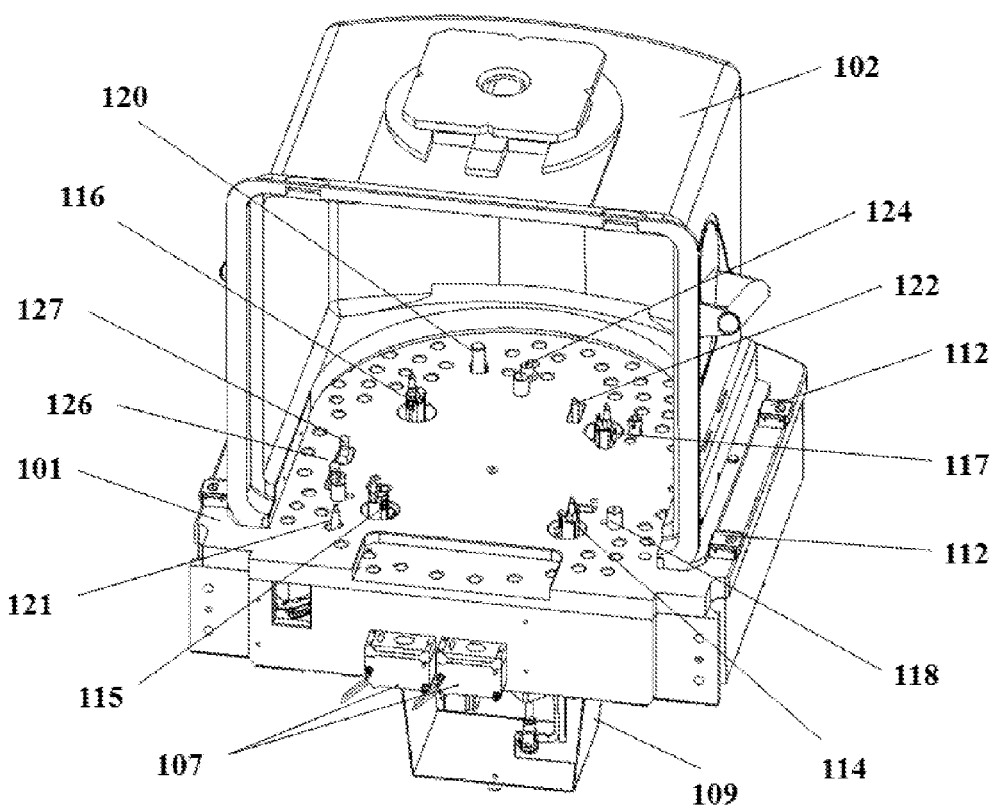
FIG. 8. is an isometric view of a base and a protective cover according to an embodiment of the invention.

FIG. 7 is the partial isometric view of the system without protecting cover 102 and FIG. 8 is the partial isometric view of the base of the system without the interface front panel 104. This is the location of various basic components used to automatically combine the mask holder are shown. Four latches 112 are intended for lock the protection cover 102 and two mounting pins 113 are designed to it precise orientation. Four supporting pillars 114, 115, 116 and 117 necessary for the mounting/dismounting and moving mask 2 and mask holder cover 3. Three support stubs 118 are designed to support the mask holder base 1. Three moving cylindrical pins 119, 120 and 121 hold the mask holder base 1 on the certain position, at that the moving pin 121 presses on the notch 12 that predefined a certain orientation of the mask holder base 1. All the moving cylindrical pins 119, 120 and 121 are moved in radial direction by individual actuator (not shown).

Mask aligning spring arm 122 interacts with mask aligning spring 4 releasing or bending it, aligns mask 2 by pressing the mask 2 against three mask borders 6. The spring arm 122 has individual actuator too (not shown). The mask aligning spring sensor 123 sends a signal in the event that the aligning spring 4 is derived from the interaction with the mask 2 and it is possible to move it out of the mask holder base 1. Mask holder base orientation sensor 124 reacts to the special insert 11 and indicates that the mask holder base 1 is in the right position and has the necessary orientation. Protection cover micro switch 125 indicate that the protection cover 102 in place. Two contact springs 126 and 127 are primarily designed to test the electrical conductivity between the mask holder base 1, the mask 2 and the mask holder cover 3, which is necessary for the proper operation of the mask inspection tool. The second working function of these springs provide the electrical connection of the system mask holder base 1-mask 2-mask holder cover 3 for electrical zapping process in the case of no electrical contact in this system.

Figure 9:
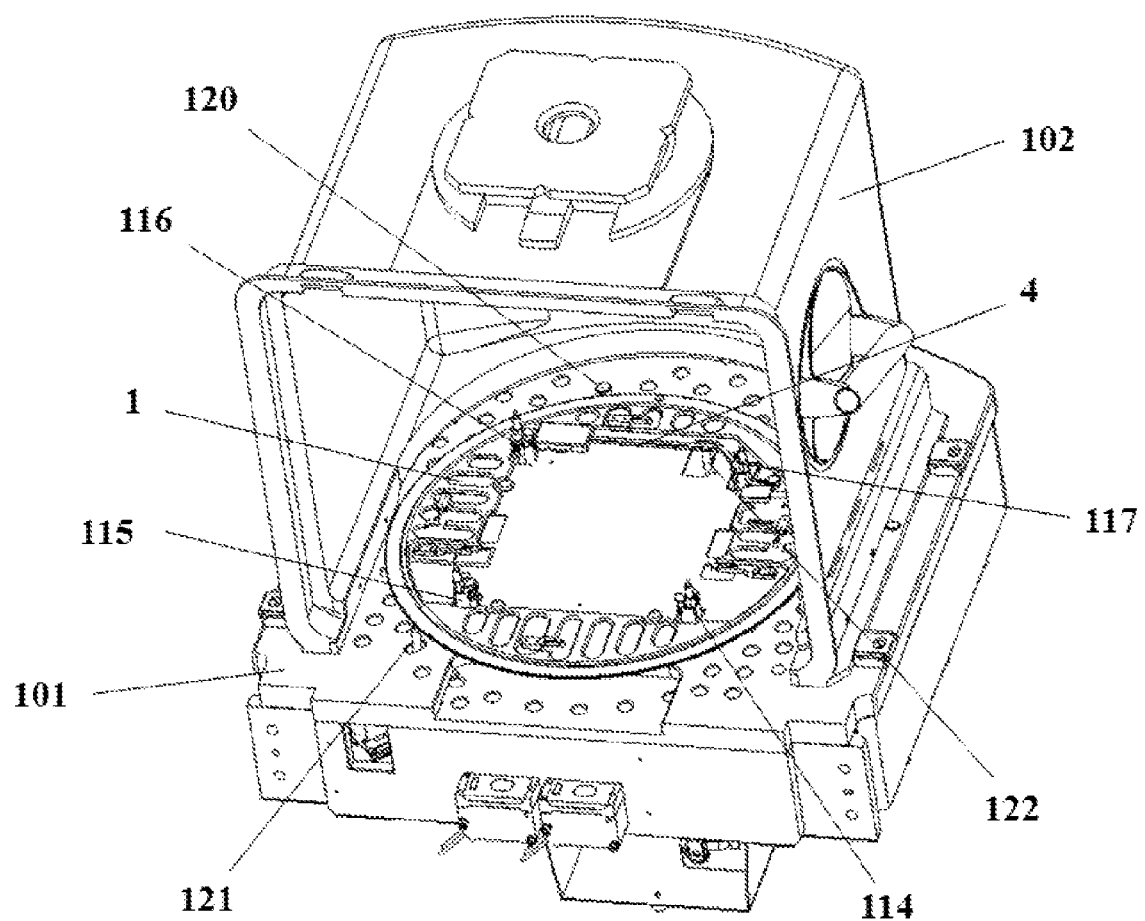
FIG. 9. is an isometric view of a portion of the system according to an embodiment of the invention.

FIG. 9 represent the partial isometric view of the system base 101 that includes the protection cover 102 and mask holder base 1 which is mounted on the three support stubs 118.

The mask holder base 1 is held by mask holder cover supporting elements such as three cylindrical pins 119, 120 and 121. The mask aligning spring arm 122 interacts with mask aligning spring 4 and bends it that allows mounting the mask 2 on the mask holder base 1.

According to an embodiment of the invention mask holder cover supporting elements and mask supporting elements are grouped together and may be arranged in supporting pillars.

When the four supporting pillars 114, 115, 116 and 117 are in the upper position (mask holder supporting elements are positioned at a first position and mask supporting elements are positioned at a third position), the supporting pillars can be in front of the window—reader to receive or to allow a robot arm to receive the mask or a combination of the mask and the mask holder.

All supporting pillars 114-117 may be installed on the common base and move in the vertical direction by an actuator (not shown). They may move between three stop positioning points: lower, middle and upper.

The main function of the four supporting pillars 114, 115, 116 and 117 is holding the mask 2 and mask holder cover 3. The mask holder cover supporting elements and mask supporting elements can move independently from each other or move in a synchronized manner.

Figure 10:
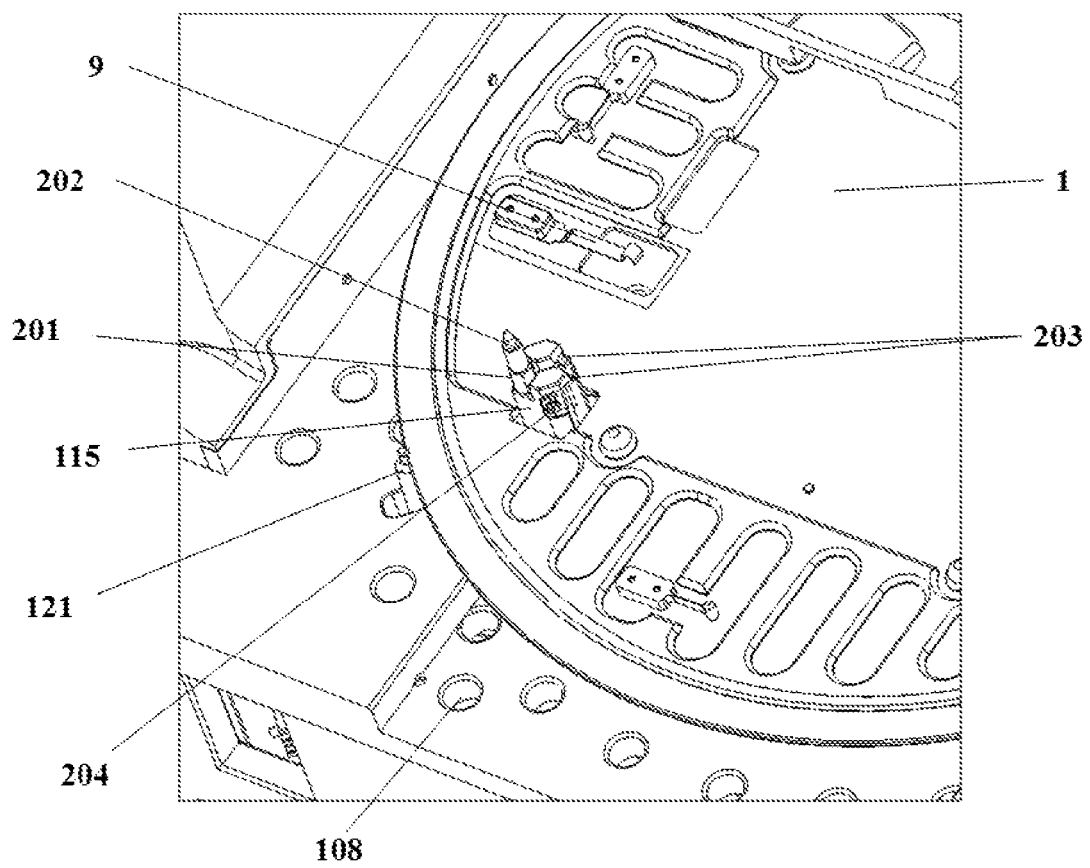
FIG. 10. is an isometric view of a supporting pillar and its surroundings according to an embodiment of the invention.

FIG. 10 represent the partial view of the supporting pillar 115 according to an embodiment of the invention. It should be noted that the structure of the other supporting pillars (114, 116 and 117) is similar.

Figure 11:
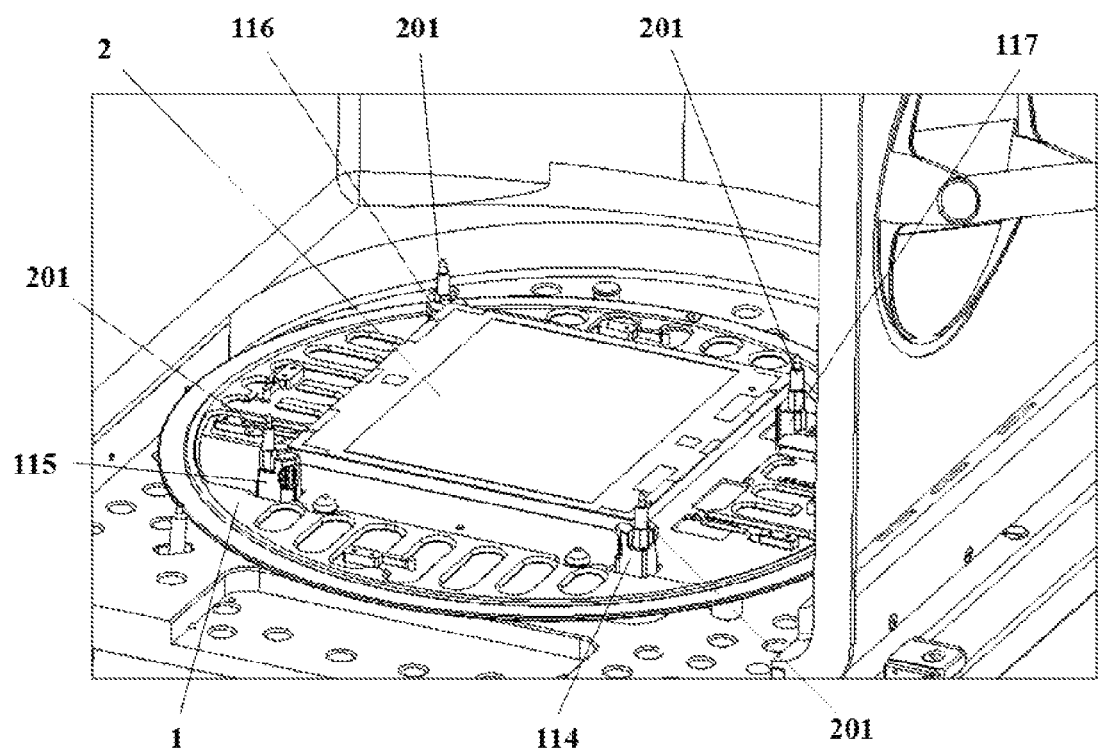
FIG. 11. is an isometric view of the EUV mask on the supporting pillars according to an embodiment of the invention.

Each supporting pillar can include a mask holder cover supporting element such as standoff pin 201, sensor 204 and special beds 203. At the top of each standoff pin 201 has a support surface 202 for the mounting of the mask holder cover 3. The EUV mask 2 may have three bevels on the corner of its bottom side and the sensor 204 is designed to record these bevels. Each supporting pillar may have mask supporting elements such as beds 203 that is intended for mounting the mask 2 on the supposed contact surfaces in the mask back side. FIG. 11 shows the isometric view of the EUV mask 2 that is mounted on the mask supporting elements of the supporting pillars 114, 115, 116 and 117. It should be noted that mask mounting/dismounting process is performed by external transfer unit, which has the special end effector for this action (not shown).

Figure 12:
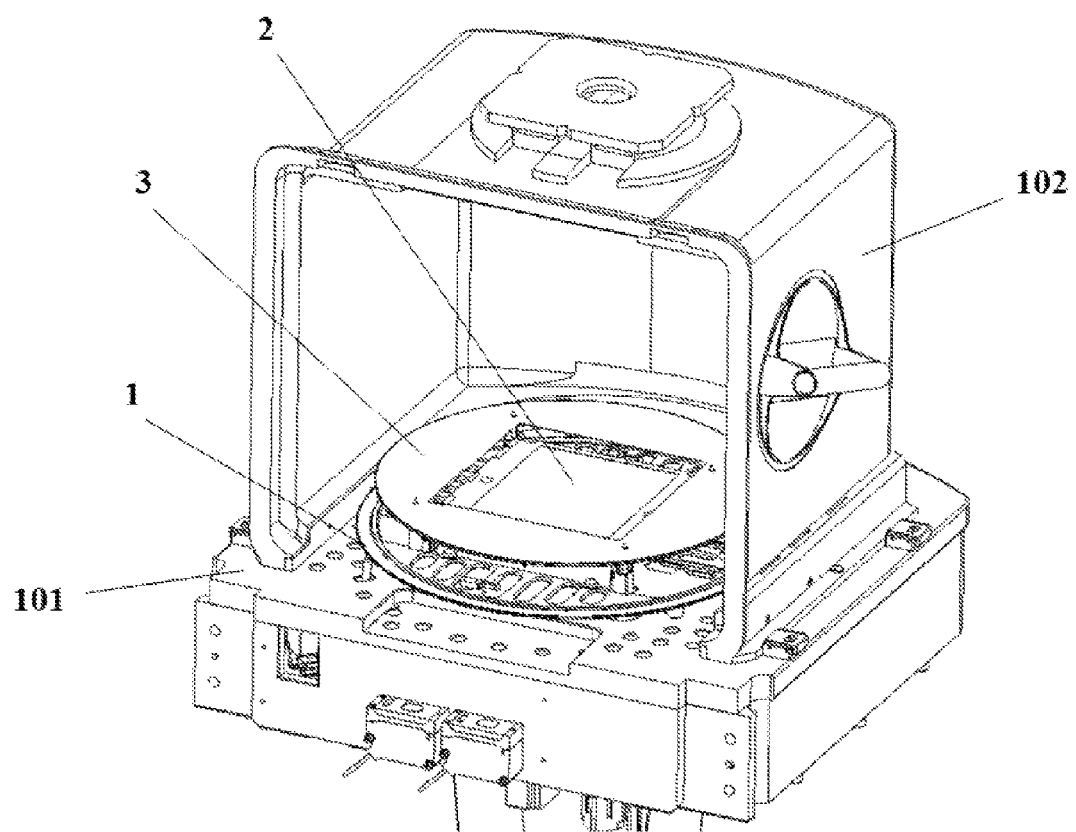
FIG. 12. is an isometric view of the EUV mask and mask holder cover supported by the supporting pillars according to an embodiment of the invention.

FIG. 12 is an isometric view of the system according to an embodiment of the invention. It illustrates the mask holder base 1, EUV mask 2 and mask holder cover 3 are being supported by the system. In this case the mask 2 and mask holder cover 3 are mounted on the supporting pillars 114-117. Basically it is initial position of join process between the mask holder base 1, EUV mask 2 and mask holder cover 3, which is performed by movement of four supporting pillars down.

Figure 13:
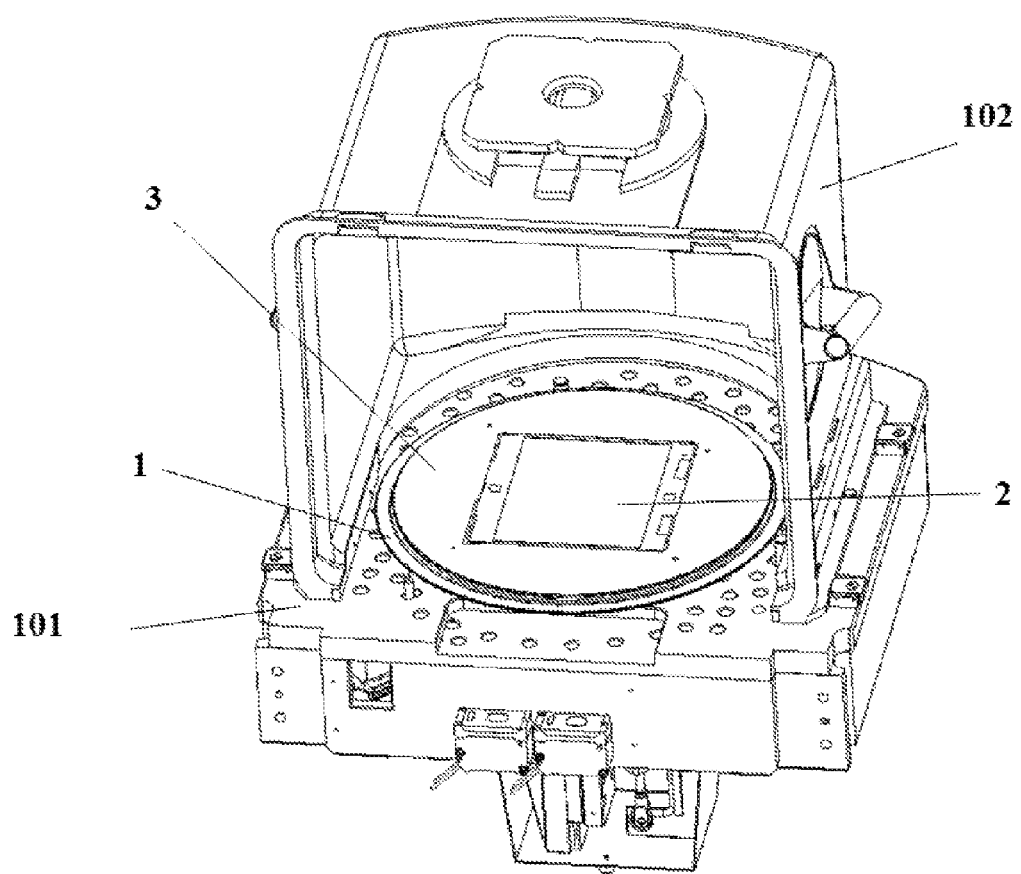
FIG. 13. Is an isometric view of the mask holder base, EUV mask and mask holder cover in the final position of the joint process according to an embodiment of the invention.

FIG. 13 is an isometric view of a portion of the system according to an embodiment of the invention wherein the mask holder base 1, EUV mask 2 and mask holder cover 3 are in the final position of the joint process. It should be noted that after completion of the joint process need to check the electrical conductivity between the mask holder base 1, EUV mask 2 and mask holder cover 3 and if necessary to make electrical zapping which aims to provide an electrical connection between these components.

Figure 14:
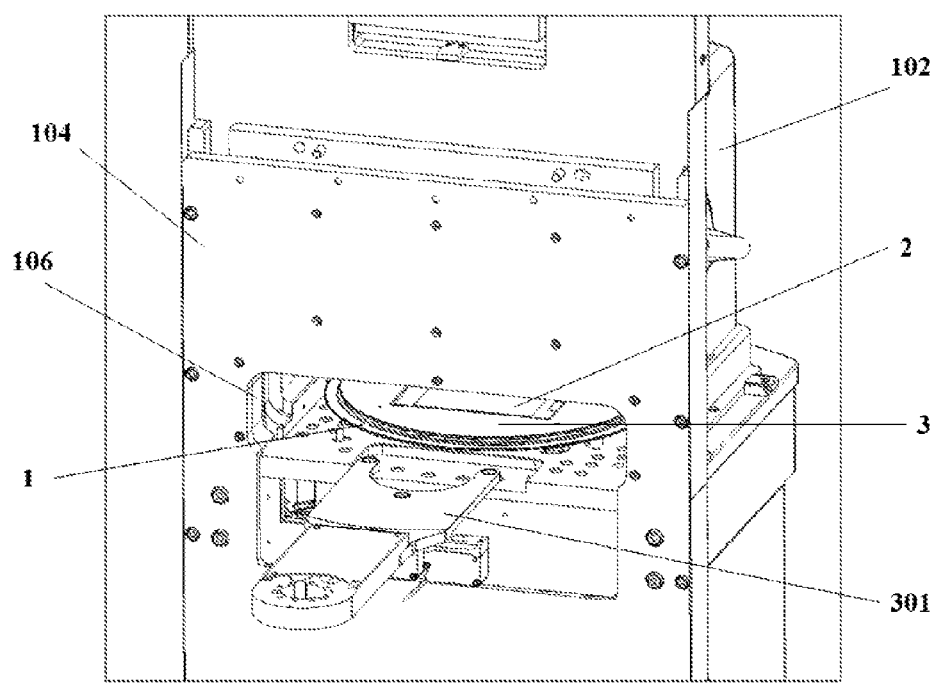
FIG. 14. Is an isometric view of the dismount process of the system mask holder base-mask-mask cover according to an embodiment of the invention.

FIG. 14 is an isometric view of end effector 301 and a portion of a system during a dismount process according to an embodiment of the invention. An external transfer unit (external robot having end effector 301) receives a combination of the mask and the mask holder (also referred as mask holder base-mask-mask holder cover combination) from the system and may transfer it to an inspection tool (not shown). In this case, FIG. 14 shows only end effector 301 of the external transfer unit (external robot).

According to an embodiment of the invention the system may be initialized by placing the mask holder base on the mask holder base supporting elements, placing the mask holder cover on the mask holder cover supporting elements and closing a space by attaching the protecting cover to the system. This initialization may be performed by an operator of the system, a technician and the like. This initialization stage may occur when the mask cover supporting elements and the mask supporting elements are at their upper positions (first and third positioned respectively).

In this stage the four supporting pillars 114, 115, 116 and 117 are on the upper position, mask holder base 1 is mounted on the three support stubs 118 and the mask holder supporting elements (three moving cylindrical pins 119, 120 and 121) hold the mask holder base 1 on when located at the first position. A mask alignment element manipulator such as the mask aligning spring arm 122 interacts with a mask alignment element such as the mask aligning spring 4 and bends it (such as not to contact the mask 2) and facilitates a reception of the mask 2. Mask holder cover 3 is located on the four supporting pillars 114, 115, 116 and 117.

At the first step the external transfer unit (external robot) mounts the EUV mask on the four supporting pillars 114, 115, 116 and 117 (on the mask supporting elements 203).

At the second step the four supporting pillars 114, 115, 116 and 117 move to the middle position and then the mask 2 is mounted on the mask holder base 1.

At the third step the mask aligning spring arm 122 interacts with mask aligning spring 4 and released it and spring 4 presses the mask 2 to the three mask borders 6 proves the mechanical aligning.

At the fourth step the four supporting pillars 114, 115, 116 and 117 move to the lower position and then the mask holder cover 3 is mounted on the mask 2 (see FIG. 13).

At the fifth step the electrical conductivity between the mask holder base 1, EUV mask 2 and mask holder cover 3 is checked. After that if necessary that is making electrical zapping which aims to provide an electrical connection between these components.

At the final (sixth step the external transfer unit (external robot) moves the combination of mask and mask holder from system 100 to an inspection tool (not shown).

It should be noted that the process of the separation of the system the mask holder base 1, EUV mask 2 and mask holder cover 3 may be performed in reverse order without the fifth step of testing of the electrical conductivity.

Figure 15:
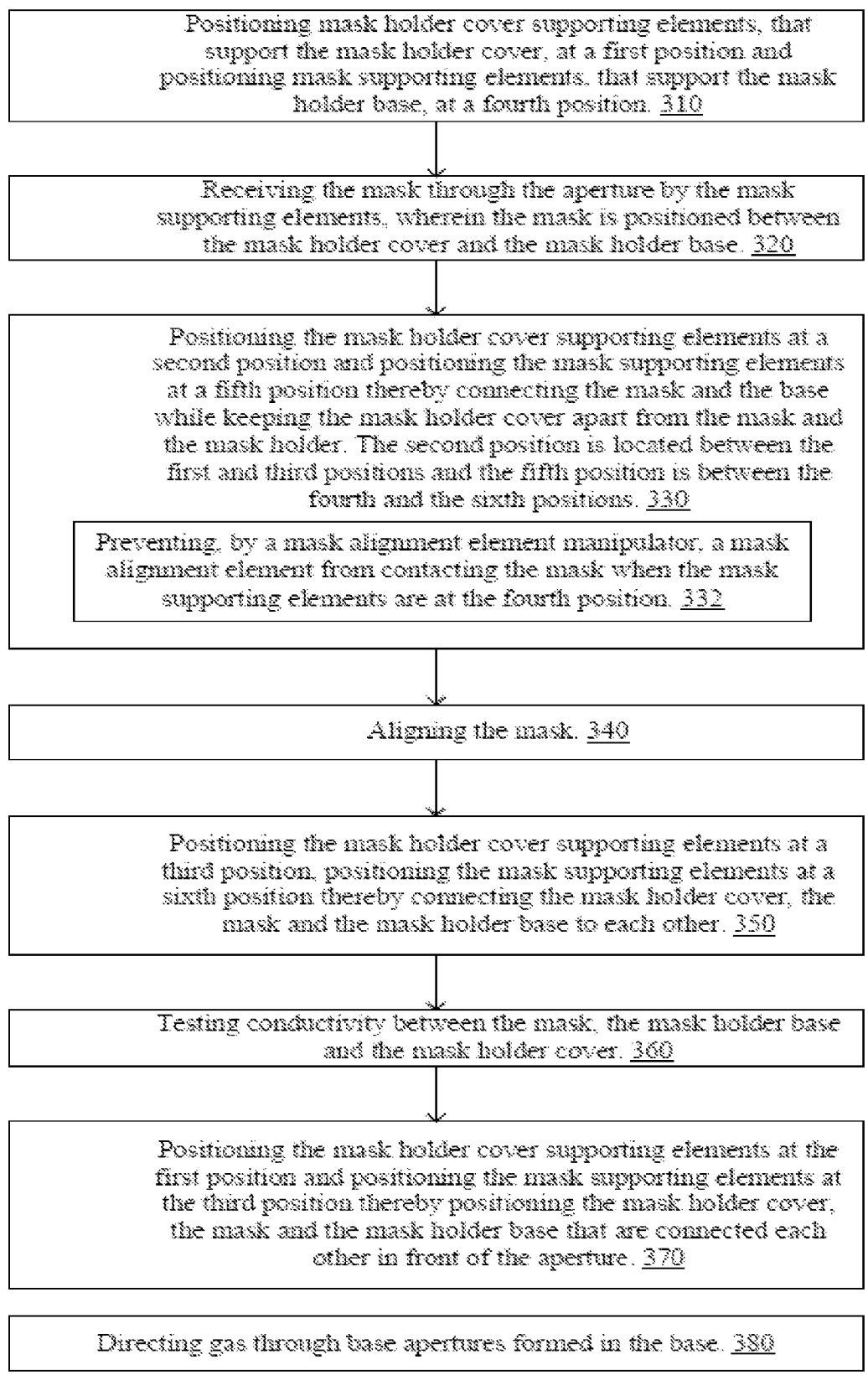
FIG. 15 illustrates a method according to an embodiment of the invention.

FIG. 15 illustrates method 300 for coupling a mask to a mask holder that comprises a mask holder base and a mask holder cover, according to an embodiment of the invention.

Method 300 may include:
a. Positioning mask holder cover supporting elements, that support the mask holder cover, at a first position and positioning mask supporting elements, that support the mask holder base, at a fourth position 310.
b. Receiving the mask through the aperture by the mask supporting elements, wherein the mask is positioned between the mask holder cover and the mask holder base 320.
c. Positioning the mask holder cover supporting elements at a second position and positioning the mask supporting elements at a fifth position thereby connecting the mask and the base while keeping the mask holder cover apart from the mask and the mask holder. The second position is located between the first and third positions and the fifth position is between the fourth and the sixth positions 330. Stage 330 may include stage 332 of preventing, by a mask alignment element manipulator, a mask alignment element from contacting the mask when the mask supporting elements are at the fourth position.
d. Aligning the mask 340. Stage 340 may include allowing the mask alignment element to contact the mask and sensing an orientation of the mask by a mask orientation sensor.
e. Positioning the mask holder cover supporting elements at a third position, positioning the mask supporting elements at a sixth position thereby connecting the mask holder cover, the mask and the mask holder base to each other 350.
f. Testing conductivity between the mask, the mask holder base and the mask holder cover 360.
g. Positioning the mask holder cover supporting elements at the first position and positioning the mask supporting elements at the third position thereby positioning the mask holder cover, the mask and the mask holder base that are connected each other in front of the aperture 370.

Stage 310 may include moving the mask holder cover supporting elements through apertures defined in the mask holder base.

Method 300 may include stage 380 of directing gas through base apertures formed in the base. This stage can be executed in parallel to other stages of method 300. The mask holder base supporting elements may be arranged to support the mask holder base above the base and wherein at least one base aperture is positioned within an area that corresponds to a trajectory of the mask holder on the base.

In the foregoing specification, the invention has been described with reference to specific examples of embodiments of the invention. It will, however, be evident that various modifications and changes may be made therein without departing from the broader spirit and scope of the invention as set forth in the appended claims.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the true spirit of the invention.

What is claimed is:

1. A system for coupling a mask to a mask holder that comprises a mask holder base and a mask holder cover, the system comprising:
    a base;
    an aperture that is shaped and sized to facilitate a passage of a mask and the mask holder cover through the aperture;
    mask holder cover supporting elements that are arranged to move between an upper holder cover position and a lower holder cover position while supporting the mask holder cover;
    mask supporting elements that are arranged to move between an upper mask position and a lower mask position while supporting the mask;
    mask holder base supporting elements that are arranged to support the mask holder base without preventing the passage of the mask through the aperture; and
    an electrical tester arranged to test conductivity between the mask, the mask holder base and the mask holder cover;
    wherein when the mask holder cover supporting elements are at the upper holder cover position and the mask supporting elements are at the upper mask position the mask holder cover, the mask and the base are spaced apart from each other and the mask holder cover is positioned above the mask and the mask holder base;
    wherein when the mask holder cover supporting elements are at the lower holder cover position and the mask supporting elements are at the lower mask position, the mask holder cover, the mask and the base are connected to each other.

2. The system according to claim 1 wherein when the mask holder cover supporting elements are at an intermediate holder cover position and the mask supporting elements are at an intermediate mask position, the mask and the base are connected to each other and are spaced apart from the mask holder cover; wherein the intermediate holder cover position is located between the upper and lower holder cover positions and the an intermediate mask position is between the upper and the lower mask positions.

3. The system according to claim 1 further comprising a mask alignment element manipulator that is arranged to prevent a mask alignment element from contacting the mask when the mask supporting elements are at the upper mask position and to allow the mask alignment element to contact the mask when the mask supporting elements are at the lower mask position.

4. The system according to claim 1 further comprising a cover that is arranged to contact the base and a wall in which the aperture is formed and to define a space in the mask holder cover supporting elements, the mask supporting elements and the mask holder base supporting elements are positioned.

5. The system according to claim 1 further comprising a fan unit arranged to direct gas through base apertures formed in the base.

6. The system according to claim 5 wherein the mask holder base supporting elements are arranged to support the mask holder base above the base and wherein at least one base aperture is positioned within an area that corresponds to a trajectory of the mask holder on the base.

7. The system according to claim 1, wherein the mask holder base supporting elements are stationary.

8. The system according to claim 1 further comprising a mask orientation sensor.

9. The system according to claim 1 wherein the mask holder cover supporting elements extend through apertures defined in the mask holder base.

10. A method for coupling a mask to a mask holder that comprises a mask holder base and a mask holder cover, the method comprising:
    positioning mask holder cover supporting elements, that support the mask holder cover, at an upper holder cover position;
    positioning mask supporting elements, that support the mask holder base, at an upper mask position;
    receiving the mask through the aperture by the mask supporting elements, wherein the mask is positioned between the mask holder cover and the mask holder base;
    positioning the mask holder cover supporting elements at a lower holder cover position, positioning the mask supporting elements at a lower mask position thereby connecting the mask holder cover, the mask and the mask holder base to each other;
    positioning the mask holder cover supporting elements at the upper holder cover position and positioning the mask supporting elements at the lower holder cover position thereby positioning the mask holder cover, the mask and the mask holder base that are connected each other in front of the aperture; and
    directing gas through base apertures formed in the base.

11. The method according to claim 10 wherein the positioning of the mask holder cover supporting elements comprises moving the mask holder cover supporting elements through apertures defined in the mask holder base.

12. The method according to claim 10 further comprising preventing, by a mask alignment element manipulator, a mask alignment element from contacting the mask when the mask supporting elements are at the upper mask position and allowing the mask alignment element to contact the mask when the mask supporting elements are at the lower mask position.

13. The method according to claim 10 further wherein the mask holder base supporting elements are arranged to support the mask holder base above the base and wherein at least one base aperture is positioned within an area that corresponds to a trajectory of the mask holder on the base.

14. The method according to claim 10 further comprising testing conductivity between the mask, the mask holder base and the mask holder cover.

15. The method according to claim 10 further comprising sensing an orientation of the mask by a mask orientation sensor.

16. The method according to claim 10 wherein each one of the positioning is executed without having a human contact the mask.

17. The method according to claim 10 further comprising positioning the mask holder cover supporting elements at an intermediate holder cover position and positioning the mask supporting elements at an intermediate mask position thereby connecting the mask and the base while keeping the mask holder cover apart from the mask and the mask holder; wherein the intermediate holder cover position is located between the upper holder cover and lower holder cover positions and the intermediate mask position is between the upper mask and the lower mask positions.

* * * * *